United States Patent [19]

Neikirk et al.

[11] Patent Number: 5,408,107

[45] Date of Patent: Apr. 18, 1995

[54] SEMICONDUCTOR DEVICE APPARATUS HAVING MULTIPLE CURRENT-VOLTAGE CURVES AND ZERO-BIAS MEMORY

[75] Inventors: Dean P. Neikirk; Kiran K. Gullapalli, both of Austin, Tex.

[73] Assignee: The Board of Regents of the University of Texas System, Austin, Tex.

[21] Appl. No.: 65,343

[22] Filed: May 20, 1993

[51] Int. Cl.⁶ .................... H01L 27/12; H01L 48/00; H01L 49/02

[52] U.S. Cl. ........................................ 257/28; 257/17; 257/22; 257/39; 257/183; 257/655

[58] Field of Search ...................... 257/14, 16, 17, 20, 257/21, 22, 23, 24, 25, 28, 39, 655, 183

[56] References Cited

U.S. PATENT DOCUMENTS

| | | | |
|---|---|---|---|
| 4,785,340 | 11/1988 | Nakagawa et al. | 257/28 |
| 4,800,262 | 1/1989 | Lentine | 250/211 J |
| 4,849,934 | 7/1989 | Yokoyama et al. | 365/159 |
| 4,853,753 | 8/1989 | Capasso et al. | 357/4 |
| 4,855,797 | 8/1989 | Kohn et al. | 257/28 |
| 4,902,912 | 2/1990 | Capasso et al. | 307/322 |
| 4,922,314 | 5/1990 | Shannon | 257/28 |
| 5,017,973 | 5/1991 | Mizuta et al. | 357/4 |
| 5,093,699 | 3/1992 | Weichold et al. | 357/22 |
| 5,128,894 | 7/1992 | Lin | 365/168 |

OTHER PUBLICATIONS

S. Luryi, A. Kastalsky, A. C. Gossard and R. Hendel, Hot–electron memory effect in double–layered heterostructures, pp. 1294–1296.

M. R. Melloch, Q-D. Quian and J. A. Cooper, Jr., Effect of a buried superlattice on the dynamic storage of electrons at the AlGaAs/GaAs heterojunction, pp. 1657–1659.

A. C. Campbell, V. P. Kesan, G. E. Crook, C. M. Maziar, D. P. Neikirk and B. G. Streetman, Impedance Switching Effects in GaAs/AlAs Barrier Structures, pp. 926–927.

Susanta Sen, Federico Capasso, Alfred Y. Cho and Debbie Sivco, Resonant Tunneling Device with Multiple Negative Differential Resistance: Digital and Signal Processing Applications with Reduced Circuit Complexity, pp. 2185–2191.

Jan Soderstrom and Thorwald G. Anderson, A Multiple-State Memory Cell Based on the Resonant Tunneling Diode, pp. 200–202.

Robert C. Potter, Amir A. Lakhani, Dana Beyea, Harry Hier, Erica Hempfling and Ayub Fathimulla, Three-dimensional integration of resonant tunneling structures for signal processing and three-state logic, pp. 2163–2164.

T. Tanoue, H. Mitzuta and S. Takahashi, A Triple-Well Resonant-Tunneling Diode for Multiple-Valued Logic Application, pp. 365–367.

Susanta Sen, Federico Capasso, Debbie Sivco and Alfred Y. Cho, New Resonant-Tunneling Devices with Multiple Negative Resistance Regions and High Room-Temperature Peak-to-Valley Ratio, pp. 402–404.

(List continued on next page.)

Primary Examiner—Ngan V. Ngo
Attorney, Agent, or Firm—Jerry M. Keys; Heinz D. Grether

[57] ABSTRACT

Heterostructure barrier quantum well device with a super-lattice structure of alternating lightly doped and heavily doped spacer layers having multiple, stable current-voltage curves extending continuously through zero bias at ambient temperature. The device can be repetitively switched between the multiple current-voltage curves. Once placed on a particular curve, the device retains memory of the curve it has been set on, even if held at zero bias for extended periods of time. The device can be switched between current-voltage curve settings at higher positive or negative voltages and can be read at lower voltages. Switching between current-voltage curve settings can also be effected by additional terminal connection(s) to the spacer layer(s).

20 Claims, 8 Drawing Sheets

OTHER PUBLICATIONS

Robert C. Potter, Amir A. Lakhani and Harry Hier, Three and six logic states by the vertical integration of InAlAs/InGaAs resonant tunneling structures, pp. 3735–3736.

A. C. Campbell, V. P. Kesan, T. R. Block, G. E. Crook, D. P. Neikirk and B. G. Streetman, Influence MBE Growth Temperature on GaAs/AlAs Resonant Tunneling Structures, pp. 585–588.

Federico Capasso, Susanta Sen, Fabio Beltram, Leda M. Lunardi, Arvind S. Vengurlekar, Peter R. Smith, Nitin J. Shah, Roger J. Malik and Alfred Y. Cho, Quantum Functional Devices: Resonant-Tunneling Transistors, Circuits with Reduced Complexity, and Multiple-Valued Logic, pp. 2065–2082.

Ming C. Wu and W. T. Tsang, Quantum-switched heterojunction bipolar transistor, pp. 1771–1773.

Fabio Beltram, Federico Capasso, John F. Walker and Roger J. Malik, Memory Phenomena in Novel Floating-Gate GaAs/AlGaAs Structures with Graded Gap Injector, pp. 293–296.

J. W. Pabst, T. E. Dungan, J. A. Cooper, Jr. and M. R. Melloch, Ion-Implanted p-n Junction Capacitors for GaAs DRAM's, pp. 804–806.

J. Chen, C. H. Yang, R. A. Wilson and C. E. C. Wood, Single transistor static memory cell: Circuit application of a new quantum transistor, pp. 96–98.

SEMICONDUCTOR DEVICE APPARATUS HAVING MULTIPLE CURRENT-VOLTAGE CURVES AND ZERO-BIAS MEMORY

LICENSE RIGHTS

The United States government has a paid-up license in this invention and the right in limited circumstances to require the patent owner to license to others on reasonable terms as provided for by the terms of Grant No. ECS-8552868 awarded by National Science Foundation which partially funded the research which resulted in the invention disclosed herein. The research was also partially funded by Project No. 003658-294 of the Texas Advanced Research Program.

BACKGROUND OF THE INVENTION

1. Field of the Invention

The present invention relates to semiconductor devices employing heterostructures. More specifically, the invention relates to a multi-state memory device which provides the functionality of a static random access memory (SRAM) cell using only a single component.

2. Description of the Prior Art

Previously, heterostructures have been combined with super-lattice structures to create single-component, multi-state semiconductor devices. For example, U.S. Pat. Nos. 4,853,753; 5,017, 973; and 4,849,934 all disclose single-component, multi-state semiconductor devices. The voltage-current characteristics of all these prior art devices can be illustrated by a single curve. Since the current-voltage curves of these devices contained multiple peaks, the peaks have been used to represent different memory states in various applications.

The reliance of prior art devices on a single current-voltage curve has proven to have disadvantages in applications requiring non-volatile memory. In order for the memory to be maintained in the prior art devices, the bias voltage has to be maintained constant. If the bias voltage shifts then the memory state of the device shifts and the stored memory is lost.

The power costs of having to maintain the bias voltage is another disadvantage of prior art multistate semiconductor devices. A device that does not require that the bias voltage be maintained in order to retain memory could have greater power efficiency.

The present invention overcomes these disadvantages of the prior art devices by not requiring that a bias voltage be maintained to maintain memory while also providing a new multistate memory capability.

SUMMARY OF THE INVENTION

The present invention is a semiconductor device with two terminals a heterostructure barrier and a super-lattice structure of alternating lightly and heavily doped spacer layers which can be used as a multi-state memory device that is capable of retaining memory after zero bias voltage conditions.

In hole-based semiconductor devices the super-lattice structure is on the anode side of the heterostructure barrier; In electron majority carrier devices the super-lattice structure is on the cathode side of the heterostructure barrier.

In other embodiments of the invention the super-lattice structure can be on both the anode and cathode sides of the heterostructure barrier.

In still other embodiments of the invention, one or more additional terminals are electrically connected to individual spacer layers in order to provide greater control for setting the memory state of the device.

The ability to maintain memory under zero bias voltage conditions offers the advantage of increased power usage efficiency to devices in which the present invention is utilized.

DETAILED DESCRIPTION OF THE PREFERRED EMBODIMENTS

Figure 1:
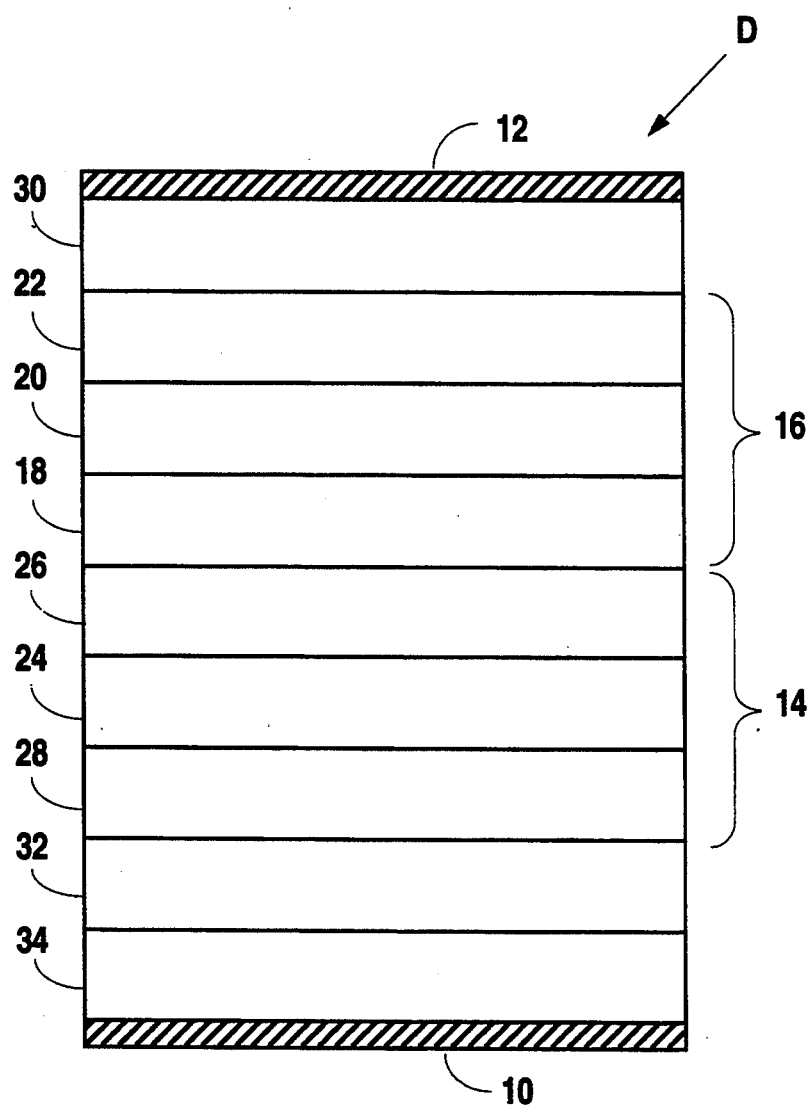
FIG. 1 is a schematic cross-sectional representation of a preferred embodiment of the invention.

FIG. 1 is a cross-sectional illustration of an electron majority carrier embodiment of the semiconductor device D. The illustration includes a anode terminal 10 and a cathode terminal 12. Between the anode 10 and cathode 12 is a heterostructure barrier 14. On the cathode side of the heterostructure is a super-lattice structure 16 of alternating lightly doped and heavily doped spacer layers 18, 20 and 22. A hole-based semiconductor device can be fabricated also.

The embodiment of the invention shown in FIG. 1 incorporates a double barrier, heterostructure barrier 14. Other heterostructure barriers would also be suitable in other embodiments of the present invention. The heterostructure barrier 14 shown in FIG. 1 one consists of an approximately ($\sim$)18 monolayer (ML) lightly doped n-type $\sim(10^{15}$ cm$^{-3})$ GaAs quantum well 24 sandwiched between nominally symmetric $\sim 6$ ML, unintentionally doped AlAs barriers 26 and 28. These layers, 24, 26 and 28, comprise the heterostructure barrier 14. On the cathode side 12 of the heterostructure barrier 14 is a super-lattice structure 16 having: an $\sim 18$ ML n-type $\sim(10^{15}$ cm$^{-3}))$ GaAs layer 18, $\sim 47$ ML n+ $\sim(4\times10^{18}$ cm$^{-3})$ GaAs layer 20, and $\sim 65$ ML n− $\sim(10^{15}$ cm$^{-3})$ GaAs layer 22. Finally, a 1770 ML layer of GaAs 30 is placed on top of the spacer layers 18, 20 and 22. On the anode 10 side of the heterostructure barrier 14, is an $\sim 18$ ML n-type $\sim(10^{15}$ cm$^{-3})$ GaAs layer 32, and a n+ GaAs substrate 34 on which the device is fabricated.

The device D can be fabricated using a Varian Gen II molecular beam epitaxy (MBE) system. Before metallization, the semiconductor material can be etched in a 2:1 HCl:H$_2$O solution to remove surface oxides and to improve ohmic contact adhesion. An array of square front-side contacts (nominal sizes ranging from 10 $\mu m \times 10 \mu m$ to $50 \mu m \times 50 \mu m$) can be defined by liftoff, using ~1.5 nm Ni/~80 nm AuGe/~15 nm Ni/~100 nm Au metallization. The front-side contacts serve as a mask during mesa isolation by an ~8:1:1 $H_2SO_4:H_2O_2:H_2O$ etching process. Finally, the device structures is preferably annealed in forming gas at ~450° C. for ~30 sec. The specific contact resistance for this process is preferably between $1 \times 10^{-6} \Omega\text{-cm}^2$ and $5 \times 10^{-6} \Omega\text{-cm}^2$.

The present invention is not limited to the semiconductor device D disclosed above; other semiconductor material systems may also be employed. For example, SiGe/SiC/Si material systems have exhibited properties indicating that they, too, may be used to fabricate a device embodying the present invention.

The operation of the present invention depends on quantum interference effects between the forces caused by the heterostructure barrier 14 and the charge/electron distribution in the super-lattice structure 16. In order to obtain sufficient quantum interference effects, the thickness of the layers in the device must be sufficiently small to allow such interference. In order to get the sufficient charge distribution in the super-lattice structure 16, there should be sufficient disparity in the doping density of the lightly and heavily doped spacer layers 18, 20, and 22 to balance the charge distribution forces against the forces imposed by the heterostructure barrier 14.

Figure 3:
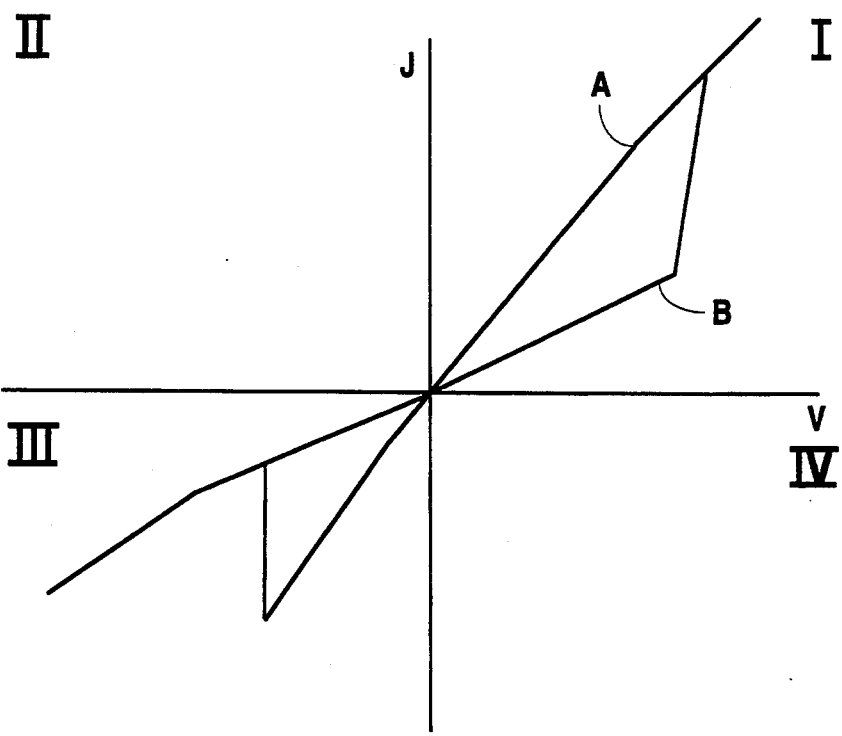
FIG. 3 is a schematic current-voltage diagram illustrating the current-voltage characteristics of the invention.

The room temperature current-voltage characteristics of the device D in FIG. 1 described above are shown in FIG. 3. FIG. 3 illustrates the two most repeatable and stable conduction branches (current-voltage curves) A and B observed during multiple sweeps of the device.

Figure 2:
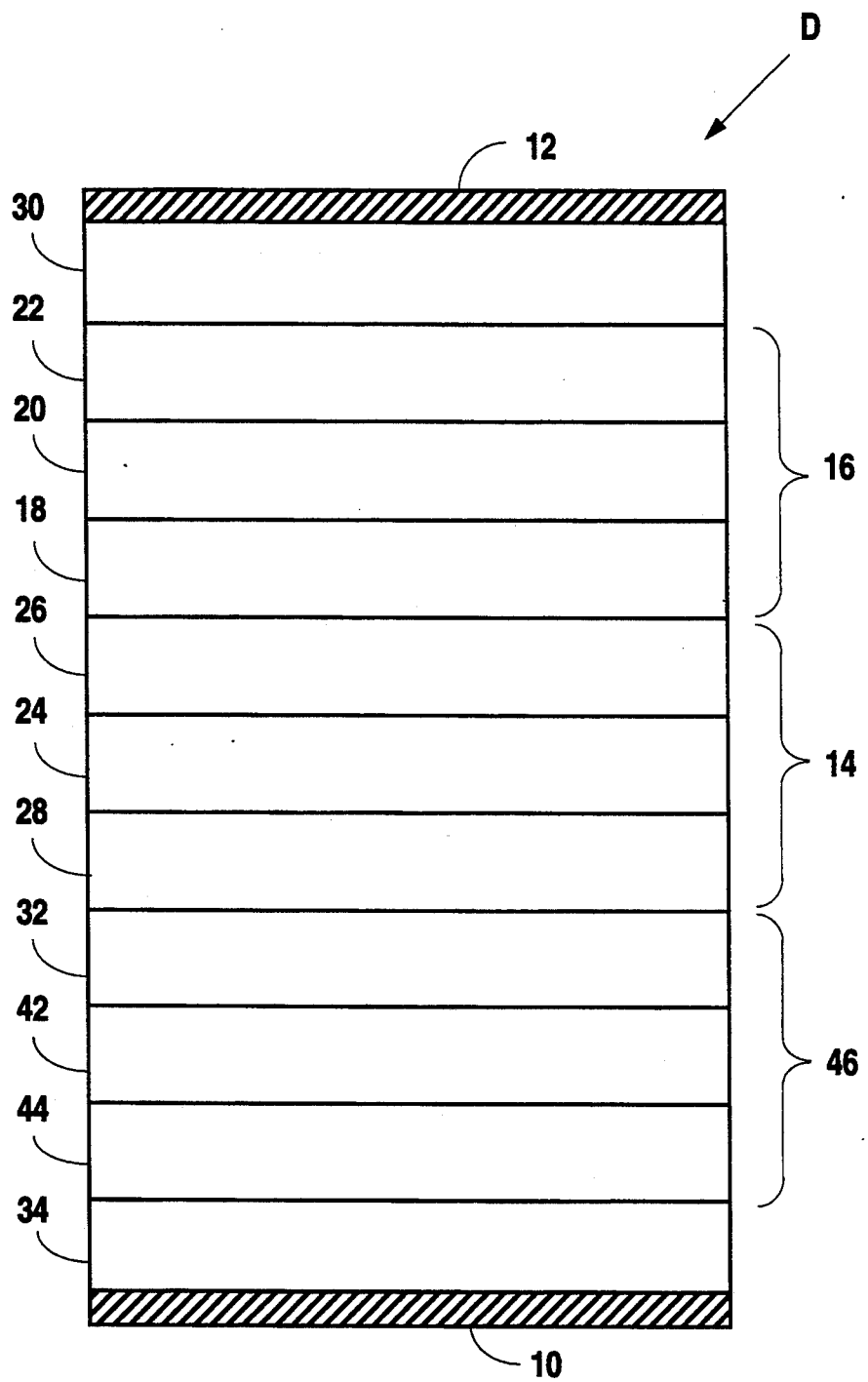
FIG. 2 is a schematic cross-sectional representation of a second preferred embodiment of the invention.

A second embodiment of the device D is shown in FIG. 2. This second embodiment of the device D differs from the first in that additional layers have been added to the anode 10 side of the device 42 and 44 so that the both the anode 10 and cathode 12 sides of the heterostructure barrier 14 have super-lattice structures 16 and 46 comprised of alternating light and heavily doped spacer layers. This second embodiment can also be used as a two-conduction branch device. In practice, the specific differential resistance at low bias on the high current density curve A has been found to be approximately $1.8 \times 10^{-5} \Omega\text{-cm}^2$ and on the low current density curve B the differential resistance has been found to be approximately $4.6 \sim 10^{-5 \Omega\text{-}cm2}$.

Practically, each current-voltage curve can be used to represents a different memory state. The memory state can be changed by switching between the curves by applying a large enough voltage across the device. When the bias voltage applied across the device exceeds approximately 1.2 V in the third quadrant (i.e., the cathode 12 is negative), the device switches from curve A to curve B. For convenience, the bias voltage at which the switch occurs can be called a switching threshold voltage.

As the bias voltage is swept back towards zero, the device follows curve B, which remains separated from curve A all the way through zero bias voltage. Curve B continues through zero bias into the first quadrant. With the device on curve B, when the bias voltage is increased to approximately 1.5 V in the first quadrant, a transition occurs which switches the device back to curve A. The bias voltage at which this switch occurs can also be called a switching threshold voltage. The device remains on curve A until the bias voltage is swept back into the third quadrant, where at a bias voltage of approximately $-1.2V$ the device with switch back to curve B. This cycle can then be repeated.

At voltages beyond approximately 1.5 V in the third quadrant, curve B is not stable and the device switches back to curve A. Since curve A has a much lower resistance, when this transition occurs, the device current can increase substantially. If precautions are not taken to limit the current passing through the device, the high current will cause very high dc power dissipation in the device causing "burn out" of the device.

The device's state (which current-voltage curve the device is following) can be determined by applying a test voltage. If the device is set on curve A, then the current will be higher for any given test voltage. If the device is set on curve B, then the current will be lower. Test voltages must be between the switching threshold voltages in order to maintain the device on curve A or B. If a test voltage is either higher than the high threshold voltage or lower than the low threshold voltage then the device may change states, and, in effect, write over the stored memory.

Because the device can be set to either curve A or curve B by applying the appropriate high or low switching threshold voltage, the device possesses memory. Moreover, because the device maintains the curve A or curve B setting through zero-bias, the device maintains its memory setting even in zero-bias conditions caused by an open circuit, power loss or short circuit.

Figure 4:
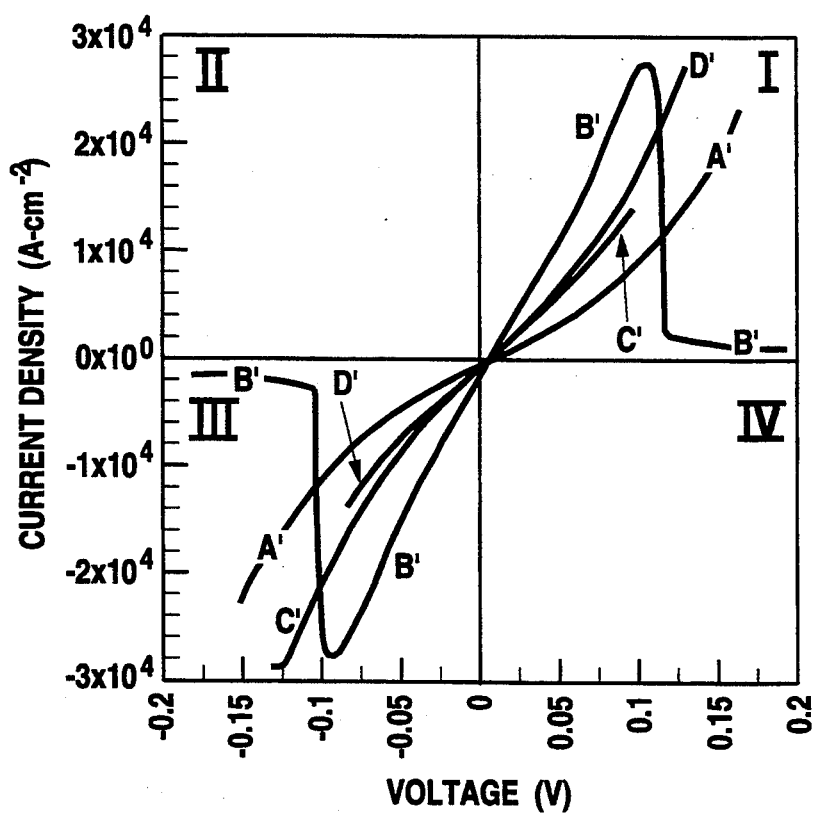
FIG. 4 is a schematic current-voltage diagram illustrating the current-voltage characteristics of another embodiment of the invention.
Figure 5A:
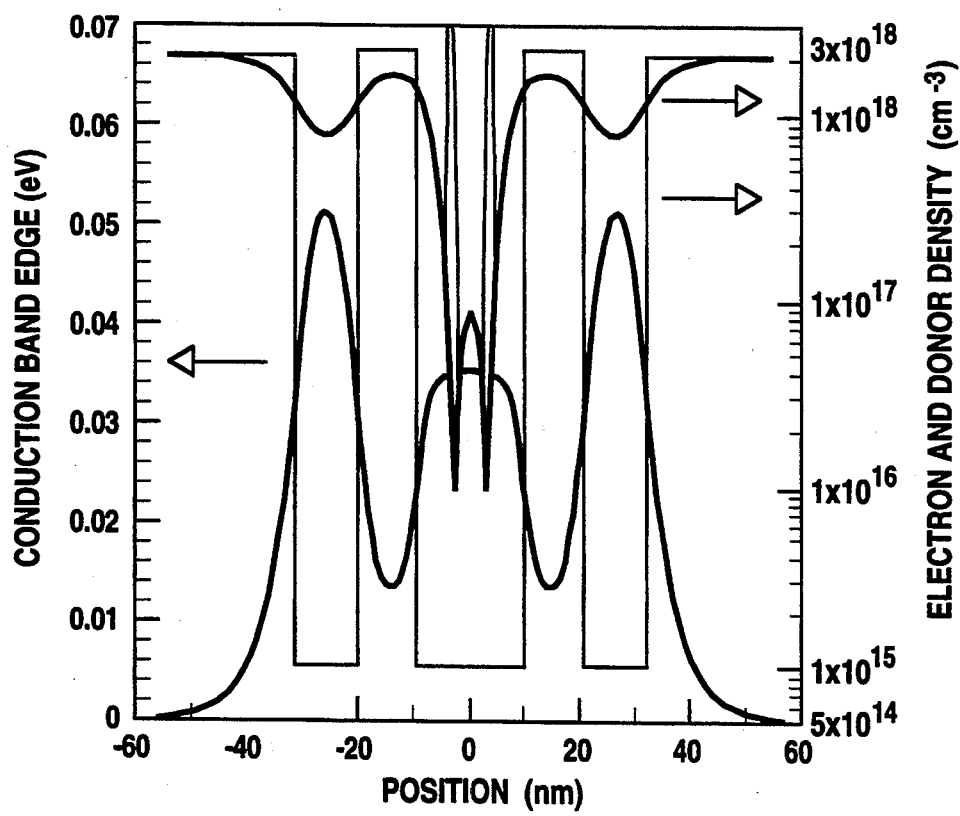
FIG. 5A-C are schematic illustrations representative of the charge or electron distribution in the device in self-consistent states at zero bias.
Figure 5B:
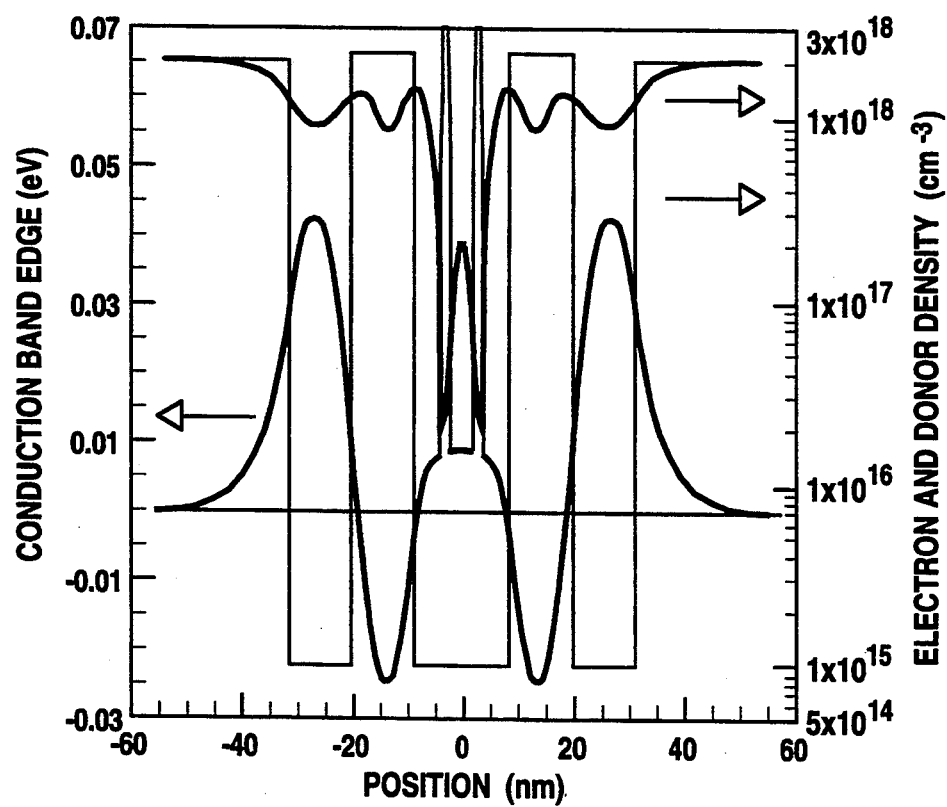
Figure 5C:
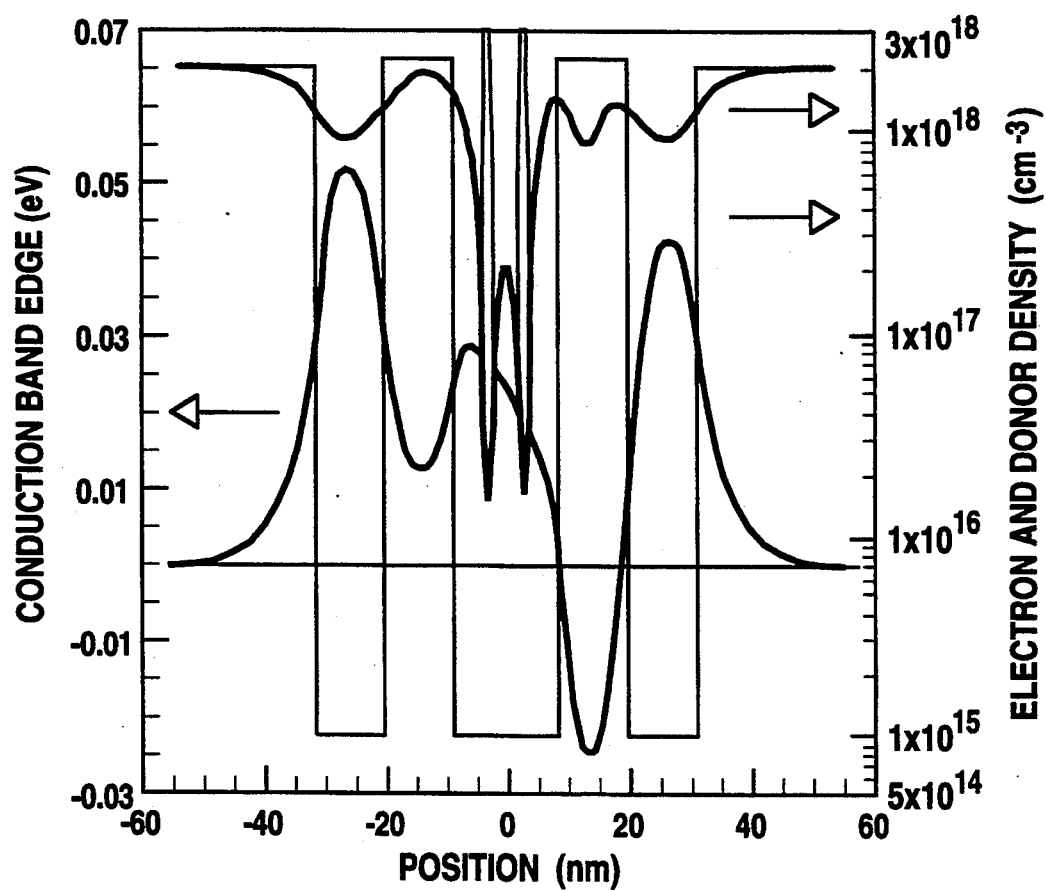

In addition to the two conduction branches previously described for the first embodiment, the second embodiment of the invention also has two additional conduction branches. The room temperature current-voltage characteristics of the device in FIG. 2 are shown in FIG. 4. This figure shows four distinct curve settings A', B', C' and D'. These self-consistent states can best be understood by viewing the conduction band edges and electron densities at zero bias for the self-consistent states of the device. These are shown in FIGS. 5A-C. The main differences between the solutions occur FIGS. 5A-C. The main differences between the solutions occur in the heavily doped spacer layers of the super-lattice structure. FIG. 5A illustrates the conduction band edge and electron concentration at zero bias for solution A' which is illustrated as a current-voltage curve in FIG. 4; FIG. 5B illustrates the conduction band edge and electron concentration at zero bias for solution B' which is illustrated as a current-voltage curve in FIG. 4; and FIG. 5C illustrates the conduction band edge and electron concentration at zero bias for solution C' which is illustrated as a current-voltage curve in FIG. 4. The electron distribution shown in FIG. 5C differs from the distribution shown in FIGS. 5A and 5B in that the distribution is asymmetric. The asymmetric charge distribution shown in FIG. 5C has a mirror image asymmetric charge distribution about the heterostructure barrier. The mirror image of the conduction band edge and electron concentrations at zero bias in FIG. 5C illustrates the conduction band edge and electron concentration at zero bias for solution D' which is illustrated as a current-voltage curve in FIG. 4.

Mathematical Model

Mathematically, the multi-state behavior of the device can be explained using a Schrödinger/Poisson model of the device. In the model used here, the electron concentration in the device is given by:

$$n(z) = \frac{1}{2\pi^2} \int_0^{+\infty} k_\| dk_\| \left[ \int_0^{+\infty} dk_z f_L(k_z, k_\|) \; |\Psi_{K_g,k_\|}^{L \to R}(z)|^2 + \int_{-\infty}^0 dk_z f_R(k_z, k_\|) \; |\Psi_{K_g,k_\|}^{R \to L}(z)|^2 \right]$$

where $k_z$ and $k_\|$ are the wave vectors parallel and perpendicular to the direction of current flow, $f_L(k_z,k_\|)$ and $f_R(k_z,k_\|)$ are the Fermi-Dirac distribution functions at the left and right boundaries, and the wave functions $\Psi(z)$ (the superscripts indicate the direction of electron propagation) are solutions to the Schrödinger equation obtained with plane wave boundary conditions. The self-consistent solutions at a given bias are obtained by iteratively solving the Schrödinger and Poisson equations. At zero bias, any bound states that exist in the device are also taken into account, assuming that these states are occupied according to Fermi-Dirac statistics. The equations are solved on a uniform spatial mesh with a mesh spacing of approximately one (1) monolayer (ML).

Multiple Terminal Apparatus

Figure 6:
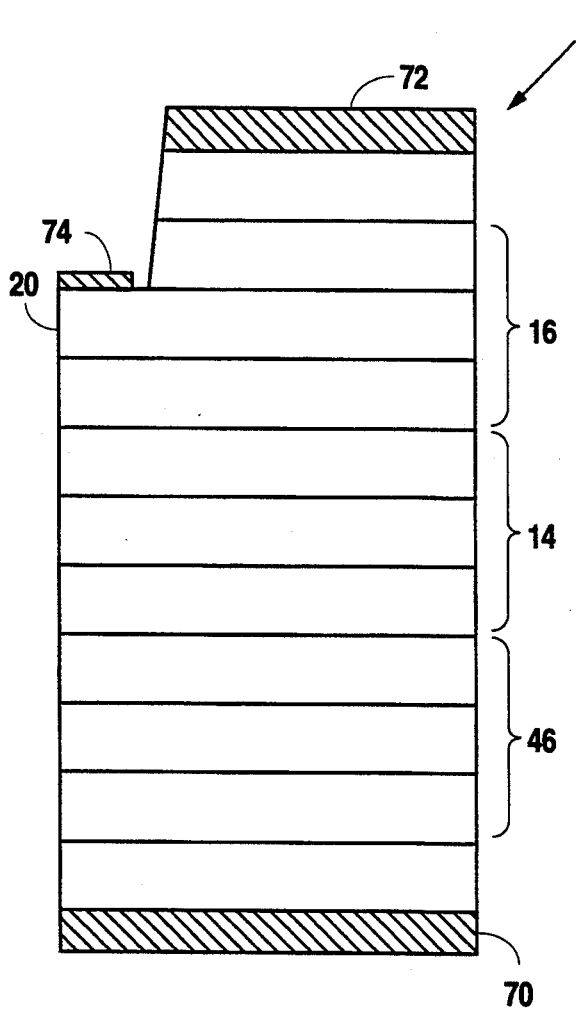
FIG. 6 is a schematic cross-sectional representation of another preferred embodiment of the invention.
Figure 7:
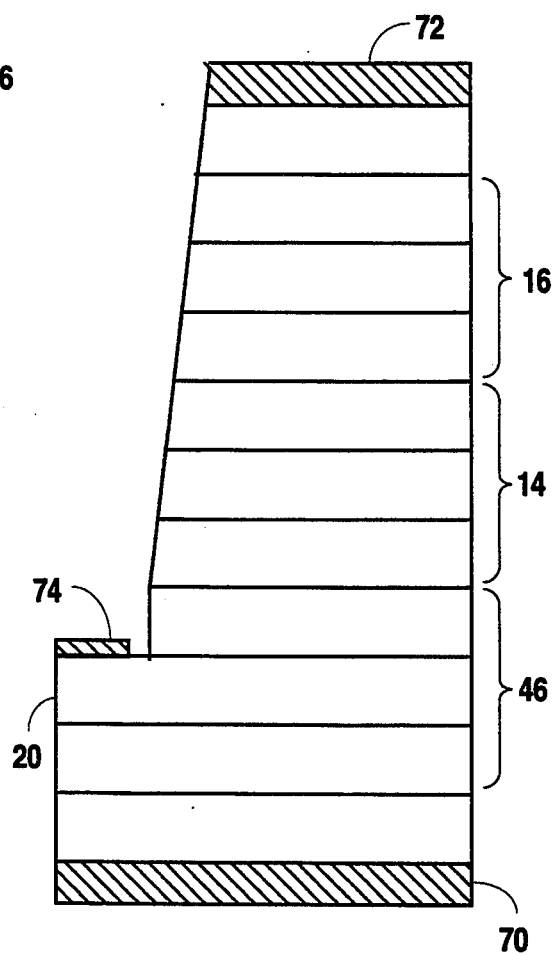
FIG. 7 is a schematic cross-sectional representation of a three terminal embodiment of the invention.

FIGS. 6 and 7 show additional embodiments of the present invention. In FIG. 6, an electron majority carrier device D has three terminals 70, 72 and 74. One terminal 70 is the anode 10 side of the device and the second terminal 72 is connected to the cathode 12 side of the device. In FIG. 6, the third terminal 74 is attached to one of the n, heavily doped, spacer layers 20 on the cathode 12 side of the heterostructure barrier 14. In FIG. 7 the third terminal 74 is attached to one of the n, heavily doped spacer layers 42 on the anode 10 side of the heterostructure barrier 14.

Figure 8:
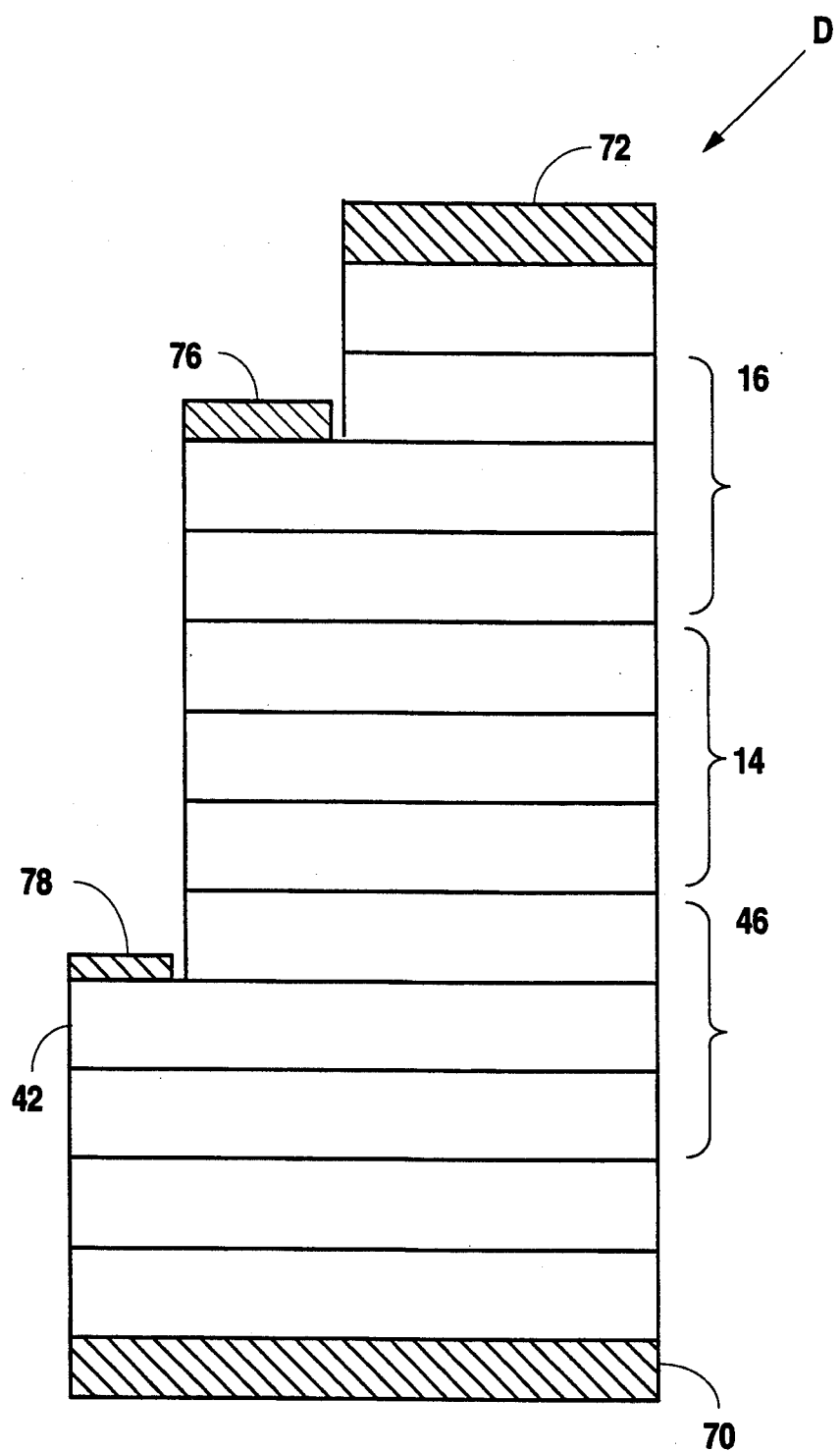
FIG. 8 is a schematic cross-sectional representation of a four terminal embodiment of the invention.

FIG. 8 illustrates another embodiment of the invention in which a third 76 and a fourth 78 terminal are attached to the heavily doped spacer layers 20 and 42 on both the cathode 12 and anode 10 sides of the heterostructure barrier 14.

The third 76 and fourth 78 terminals can be used to switch the device from one current-voltage curve (state) to another. Otherwise the third 76 or fourth 78 terminals can be left floating. In other words, the third and fourth terminals 76 and 78 can be used to write to memory and the other terminals 70 and 72 are used to read from memory.

Fabrication of Multiple Terminal Apparatus

Since the spacer layers are very thin, care must be taken when fabricating a three or more terminal device to avoid shorting the device. Therefore, etching selectivity is important. One possible solution to the problems associated with fabricating devices with electrical connections to the very thin spacer layers has been disclosed in a Broekaert et al. publication in *IEEE Transactions on Electron Devices* in March 1992. Broekaedt et al. have developed wet chemical etching solutions such as succinic acid that allow for selective etching of InP lattice-matched in AlGaAs layers using thin pseudomorphic AlAs layers as etch stops. If this process is used, the invention could be fabricated using InAlGaAs lattice-matched to InP, where the quantum well heterostructure would consist of thin (<10ML) strained AlAs barriers sandwiching an InGaAs quantum well. Using the succinic acid solution, an etch-back to the first AlAs etch stop barrier should be possible, since the etch selectivity of AlAs to InGaAs is greater than 1:1000. This high selectivity allows large process latitude. After etching back to the first AlAs etch stop, a non-spiking Pd/Ge metallization could be used to form the heavily doped spacer layer contact. Since the InGaAs layer has a very low Schottky barrier height and can be doped to the mid $10^{19}$ cm$^{-3}$ levels, a very low resistance ohmic contact with negligible surface depletion may be formed. Thus, due to the very large etch selectivities available in the InAlGaAs/AlAs material system, it is possible to fabricate a three or more terminal embodiment of the present invention.

Figure 9:
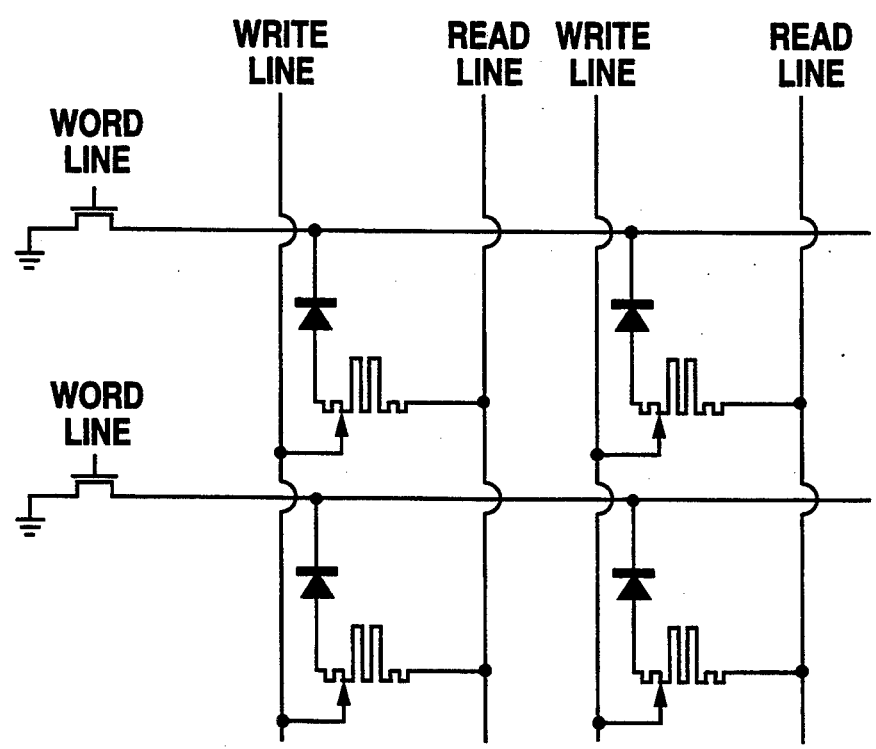
FIG. 9 is a schematic circuit diagram utilizing three terminal devices.

FIG. 9 shows a circuit diagram having four (4) three terminal devices. Such a circuit can easily be worked into the fabrication sequence of the semiconductor device. The diagram shows read terminals and write terminals.

The present invention may be embodied in other specific forms without departing from the spirit or essential characteristics. The described embodiments, including materials used and approximate dimensions and doping densities, are to be considered in all respects only as illustrative and not restrictive, and the scope of the invention is, therefore, indicated by the appended claims rather than the foregoing description. All changes that come within the meaning and range of equivalency of the claims are embraced within their scope.

We claim:

1. A semiconductor device, comprising:
   a) first and second terminals for making electrical connections to the device;
   b) a heterostructure barrier between the first and second terminals; and
   c) a super-lattice structure between the first terminal and the heterostructure barrier having a plurality of alternating lightly and heavily doped spacer layers.

2. The semiconductor device of claim 1, wherein:
   the device is a hole carrier device and the first terminal is an anode, whereby the super-lattice structure is on the anode side of the heterostructure barrier.

3. The semiconductor device of claim 1, wherein:
   the device is an electron majority carrier device and the first terminal is a cathode, whereby the super-lattice structure is on the cathode side of the heterostructure barrier.

4. The semiconductor device of claim 3, wherein:
   the spacer layer of the super-lattice structure closest to the heterostructure is a lightly doped spacer layer.

5. The semiconductor device of claim 4 wherein the alternating spacer layers of the super lattice structure proceeding from the heterostructure to the cathode comprises:
   a first, lightly doped, layer; a second, heavily doped, layer; and a third lightly doped layer.

6. The semiconductor device of claim 1, further comprising:
   a second super-lattice structure between the second terminal and the heterostructure barrier having a plurality of alternating lightly and heavily doped spacer layers.

7. The semiconductor device of claim 6, wherein:
   a) the device is an electron majority carrier device;
   b) the first terminal is a cathode; and c) The alternating spacer layers of the first and second super-lattice structures extend from the heterostructure to each terminal as follows: a first, lightly doped, layer; a second, heavily doped, layer; and a third, lightly doped, layer.

8. A semiconductor device, comprising:
a) first and second terminals for making electrical connections to the device;
b) a heterostructure barrier between the first and second terminals;
c) a super-lattice structure between the first terminal and the heterostructure barrier having a plurality of alternating lightly and heavily doped spacer layers; and
d) a third terminal for making electrical connection to one of the spacer layers of the super-lattice structure.

9. The semiconductor device of claim 8 wherein:
a) the device is an electron majority carrier device;
b) the first terminal is a cathode, whereby the super-lattice structure is on the cathode side of the heterostructure barrier; and
c) the third terminal is electrically connected to one of the heavily doped spacer layers sandwiched between two lightly doped spacer layers.

10. The semiconductor device of claim 9, wherein:
a) the alternating spacer layers of the super-lattice structure proceeding from the heterostructure to the cathode comprise a first, lightly doped, layer; a second, heavily doped, layer; and a third, lightly doped, layer; and
b) the third terminal is electrically connected to the second, heavily doped, layer.

11. The semiconductor device of claim 8, further comprising:
a) a second super-lattice structure between the second terminal and the heterostructure barrier having a plurality of alternating lightly and heavily doped spacer layers;
b) the device is an electron majority carrier device;
c) the first terminal is a cathode; and
d) the third terminal is connected to one of the heavily doped spacer layers between two lightly doped spacer layers.

12. A semiconductor device, comprising:
a) A first and second terminal for making electrical connection to the device;
b) a heterostructure barrier between the first and second terminal;
c) a super-lattice structure between the first terminal and the heterostructure barrier having a plurality of alternating lightly and heavily doped spacer layers; and
d) a plurality of additional terminals for making electrical connection to a plurality of spacer layers of the super-lattice structure.

13. The semiconductor device of claim 12, wherein:
a) the device is an electron majority carrier device;
b) the first terminal is a cathode, whereby the super-lattice structure is on the cathode side of the heterostructure barrier; and
c) the additional terminals are each connected to one of the heavily doped spacer layers between two lightly doped spacer layers.

14. The semiconductor device of claim 12, further comprising:
a) a second super-lattice structure between the second terminal and the heterostructure barrier which is comprised of a plurality of alternating lightly and heavily doped spacer layers;
b) the device is electron majority carrier device;
c) the first terminal is a cathode; and
d) the additional terminals are each connected to the heavily doped spacer layers between two lightly doped spacer layers.

15. The semiconductor device of claim 14, wherein:
a) the plurality of additional terminals comprise a third and fourth terminal;
b) the alternating spacer layers of the first and second super-lattice structures from the heterostructure to the first and second terminal comprise a first, lightly doped, layer; a second, heavily doped, layer; and a third, lightly doped, layer;
c) the third terminal is connected to the second, heavily doped layer in the super-lattice structure on the first terminal side of the heterostructure barrier; and
d) the fourth terminal is connected to the second heavily doped layer in the super-lattice structure on the second terminal side of the heterostructure barrier.

16. A semiconductor device comprising:
a) first and second terminals for making electrical connections to the device;
b) a heterostructure barrier between the first terminal and the second terminal; and
c) a super-lattice structure between the first terminal and the heterostructure barrier having a plurality of alternating lightly and heavily doped spacer layers.

17. The semiconductor device of claim 16 where in the heterostructure barrier further comprises of a plurality of heterostructure barriers.

18. The semiconductor device of claim 16 which further comprises a zero-bias storage/memory device.

19. The semiconductor storage/memory device of claim 18 which further comprises of
a) means for writing to the device by setting the device to one of a plurality of characteristic current-voltage curve; and
b) means for reading from the device by determining which of the plurality of characteristic current-voltage curves the device has been set on.

20. A semiconductor device, comprising:
a) first and second terminals for making electrical connections to the device;
b) a heterostructure barrier between the first and second terminals; and
c) a super-lattice structure between the first terminal and the heterostructure barrier having a plurality of spacer layers which are alternating lightly and heavily doped with impurities of the same conductivity type.

* * * * *